United States Patent
Blank

(10) Patent No.: US 10,636,883 B2
(45) Date of Patent: Apr. 28, 2020

(54) SEMICONDUCTOR DEVICE INCLUDING A GATE TRENCH AND A SOURCE TRENCH

(71) Applicant: Infineon Technologies Austria AG, Villach (AT)

(72) Inventor: Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/280,242

(22) Filed: Feb. 20, 2019

(65) Prior Publication Data
US 2019/0181233 A1 Jun. 13, 2019

Related U.S. Application Data

(62) Division of application No. 13/856,689, filed on Apr. 4, 2013, now Pat. No. 10,249,721.

(51) Int. Cl.
*H01L 29/417* (2006.01)
*H01L 29/66* (2006.01)
(Continued)

(52) U.S. Cl.
CPC ...... *H01L 29/41741* (2013.01); *H01L 29/407* (2013.01); *H01L 29/41766* (2013.01);
(Continued)

(58) Field of Classification Search
CPC ............. H01L 29/41741; H01L 29/407; H01L 29/41766; H01L 29/66734; H01L 29/7811; H01L 29/7813
See application file for complete search history.

(56) References Cited

U.S. PATENT DOCUMENTS

| 4,893,160 A | 1/1990 | Blanchard |
| 4,985,741 A | 1/1991 | Bauer et al. |

(Continued)

FOREIGN PATENT DOCUMENTS

| CN | 1726596 A | 1/2006 |
| CN | 1941417 A | 4/2007 |

(Continued)

OTHER PUBLICATIONS

Nakano, H., et al., "600V trench-gate IGBT with Micro-P structure", 21st International Symposium on Power Semiconductor Devices & IC's, Jun. 14-18, 2009, Barcelona, Spain, pp. 132-135.

(Continued)

*Primary Examiner* — Dale E Page
*Assistant Examiner* — Quovaunda Jefferson
(74) *Attorney, Agent, or Firm* — Murphy, Bilak & Homiller, PLLC

(57) ABSTRACT

A method of forming a semiconductor device includes forming a source trench extending into a semiconductor body from a first surface of the semiconductor body, forming a source trench dielectric and a source trench electrode in the source trench, forming a gate trench dielectric and a gate trench electrode in a gate trench extending into the semiconductor body from the first surface, forming a body region of a first conductivity type between the gate and source trenches, forming a source region of a second conductivity type different from the first conductivity type between the gate and source trenches, forming an interconnection electrically coupling the body region and the source trench electrode, wherein the interconnection adjoins a lateral face of the source trench electrode of the body region, and forming a source contact on the source trench electrode at the first surface.

13 Claims, 14 Drawing Sheets

(51) Int. Cl.
*H01L 29/78* (2006.01)
*H01L 29/40* (2006.01)
*H01L 29/10* (2006.01)
*H01L 29/423* (2006.01)
*H01L 21/225* (2006.01)
*H01L 29/45* (2006.01)

(52) U.S. Cl.
CPC .. *H01L 29/66727* (2013.01); *H01L 29/66734* (2013.01); *H01L 29/7811* (2013.01); *H01L 29/7813* (2013.01); H01L 21/2255 (2013.01); H01L 29/1095 (2013.01); H01L 29/4238 (2013.01); H01L 29/42368 (2013.01); H01L 29/456 (2013.01)

(56) References Cited

U.S. PATENT DOCUMENTS

| | | | |
|---|---|---|---|
| 5,366,914 A | 11/1994 | Takahashi et al. | |
| 5,751,024 A | 5/1998 | Takahashi | |
| 5,973,160 A | 10/1999 | Poss et al. | |
| 6,040,600 A | 3/2000 | Uenishi et al. | |
| 6,218,217 B1 | 4/2001 | Uenishi et al. | |
| 6,521,538 B2 | 2/2003 | Soga et al. | |
| 6,566,691 B1 | 5/2003 | Inoue et al. | |
| 6,710,403 B2 | 3/2004 | Sapp | |
| 6,750,508 B2 | 6/2004 | Omura et al. | |
| 6,800,897 B2 | 10/2004 | Baliga | |
| 6,882,004 B2 | 4/2005 | Zundel et al. | |
| 7,041,559 B2 | 5/2006 | Baliga | |
| 7,078,740 B2 | 7/2006 | Yamaguchi et al. | |
| 7,423,316 B2 | 9/2008 | Kawaji et al. | |
| 7,456,487 B2 | 11/2008 | Ogura et al. | |
| 7,546,487 B2 | 6/2009 | Marisetty et al. | |
| 7,675,113 B2 | 3/2010 | Sakamoto et al. | |
| 7,986,003 B2 | 7/2011 | Aono et al. | |
| 8,120,074 B2 | 2/2012 | Schulze et al. | |
| 8,178,701 B2 | 5/2012 | Selifonov | |
| 8,178,947 B2 | 5/2012 | Takahashi et al. | |
| 8,222,681 B2 | 7/2012 | Schulze et al. | |
| 8,299,539 B2 | 10/2012 | Kouno | |
| 8,319,314 B2 | 11/2012 | Ogura et al. | |
| 2002/0179976 A1 | 12/2002 | Takahashi | |
| 2004/0009643 A1 | 1/2004 | Blanchard | |
| 2004/0014451 A1 | 1/2004 | Sapp et al. | |
| 2004/0079989 A1 | 4/2004 | Kaneko et al. | |
| 2004/0173813 A1 | 9/2004 | Chang | |
| 2005/0104093 A1 | 5/2005 | Yoshimochi | |
| 2005/0215013 A1 | 9/2005 | Williams et al. | |
| 2005/0275013 A1 | 12/2005 | Sander et al. | |
| 2006/0060916 A1 | 3/2006 | Girdhar et al. | |
| 2007/0194374 A1 | 8/2007 | Bhalla et al. | |
| 2007/0272978 A1 | 11/2007 | Mauder et al. | |
| 2008/0179662 A1 | 7/2008 | Hshieh | |
| 2008/0265315 A1 | 10/2008 | Mauder et al. | |
| 2009/0114982 A1 | 5/2009 | Saka et al. | |
| 2009/0140327 A1 | 6/2009 | Hirao et al. | |
| 2009/0206924 A1 | 8/2009 | Zeng et al. | |
| 2009/0283797 A1 | 11/2009 | Takahashi et al. | |
| 2010/0078707 A1 | 4/2010 | Haeberlen et al. | |
| 2010/0171173 A1 | 7/2010 | Hsieh | |
| 2010/0193796 A1 | 8/2010 | Nakano | |
| 2010/0258855 A1 | 10/2010 | Yilmaz et al. | |
| 2010/0289032 A1 | 11/2010 | Zhang et al. | |
| 2011/0101416 A1 | 5/2011 | Schulze et al. | |
| 2011/0108911 A1 | 5/2011 | Matsuoka | |
| 2011/0248340 A1 | 10/2011 | Hsieh | |
| 2011/0254088 A1 | 10/2011 | Darwish et al. | |
| 2011/0298056 A1 | 12/2011 | Ning et al. | |
| 2011/0303925 A1 | 12/2011 | Nishimura | |
| 2011/0316074 A1 | 12/2011 | Oota | |
| 2012/0025199 A1 | 2/2012 | Chen et al. | |
| 2012/0032258 A1 | 2/2012 | Zeng et al. | |
| 2012/0056241 A1 | 3/2012 | Sumitomo et al. | |
| 2012/0088359 A1 | 4/2012 | Kim et al. | |
| 2012/0098030 A1 | 4/2012 | Schulze et al. | |
| 2012/0146090 A1 | 6/2012 | Lui et al. | |
| 2012/0187474 A1 | 7/2012 | Rexer et al. | |
| 2012/0313139 A1 | 12/2012 | Matsuura et al. | |
| 2012/0319199 A1 | 12/2012 | Zeng et al. | |
| 2012/0322217 A1 | 12/2012 | Yeh et al. | |
| 2013/0248992 A1 | 9/2013 | Padmanabhan et al. | |
| 2014/0042525 A1 | 2/2014 | Darwish et al. | |
| 2014/0061719 A1 | 3/2014 | Takei | |
| 2014/0299932 A1 | 10/2014 | Blank | |
| 2014/0332844 A1 | 11/2014 | Ding et al. | |
| 2015/0041962 A1 | 2/2015 | Laven et al. | |
| 2015/0076554 A1 | 3/2015 | Laven et al. | |
| 2015/0144988 A1 | 5/2015 | Laven et al. | |
| 2015/0145028 A1 | 5/2015 | Laven et al. | |

FOREIGN PATENT DOCUMENTS

| | | |
|---|---|---|
| CN | 101185169 A | 5/2008 |
| CN | 101266948 A | 9/2008 |
| CN | 101375400 A | 2/2009 |
| CN | 102856208 A | 1/2013 |
| DE | 102004057791 A1 | 6/2006 |
| DE | 102006049043 B4 | 3/2011 |
| DE | 102005052734 B4 | 2/2012 |
| EP | 0881692 A2 | 12/1998 |
| EP | 1353385 A1 | 10/2003 |

OTHER PUBLICATIONS

Sumitomo, Masakiyo, et al., "Injection Control Technique for High Speed Switching with a double gate PNM-IGBT", Proceedings of the 25th International Symposium on Power Semiconductor Devices & ICs, May 2013, Kanazawa, Japan, pp. 33-36.

Sumitomo, Masakiyo, et al., "Low loss IGBT with Partially Narrow Mesa Structure (PNM-IGBT)", Proceedings of the 2012 24th International Symposium on Power Semiconductor Devices and ICs, Bruges, Belgium, Jun. 3-7, 2012, pp. 17-20.

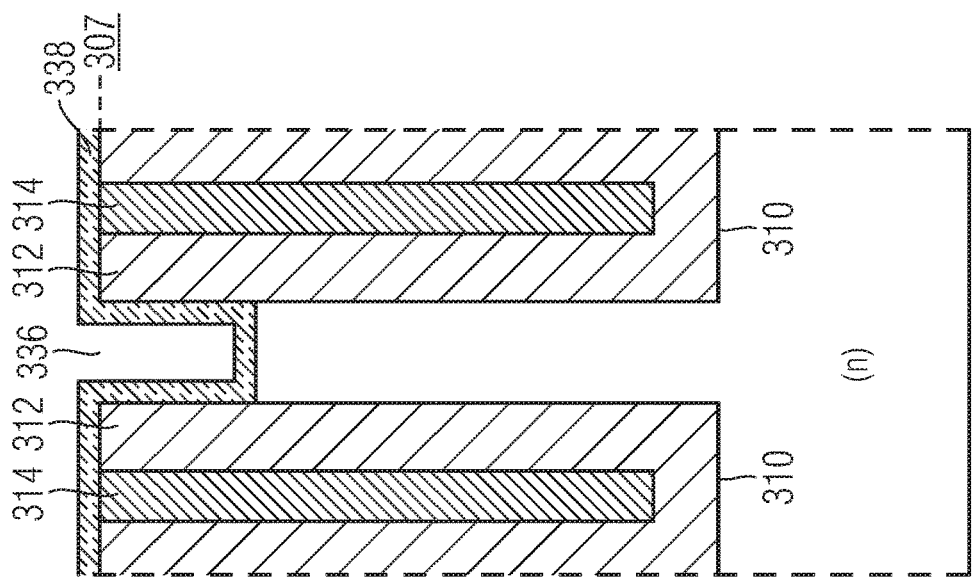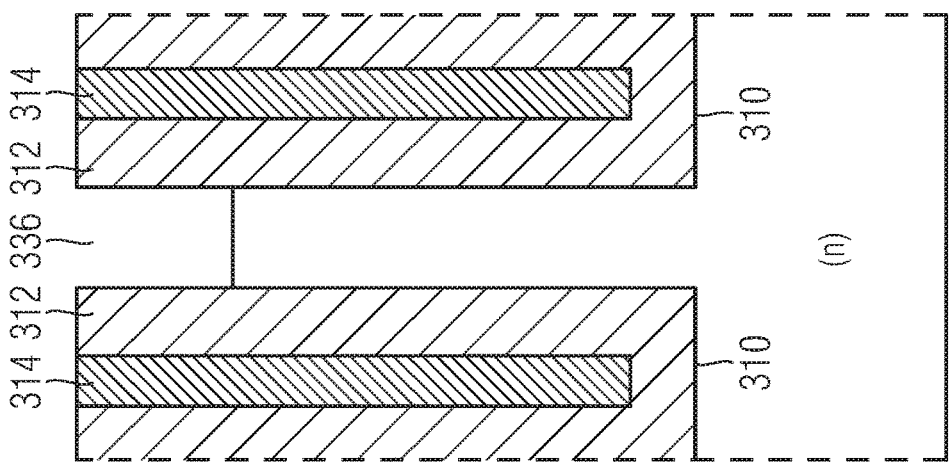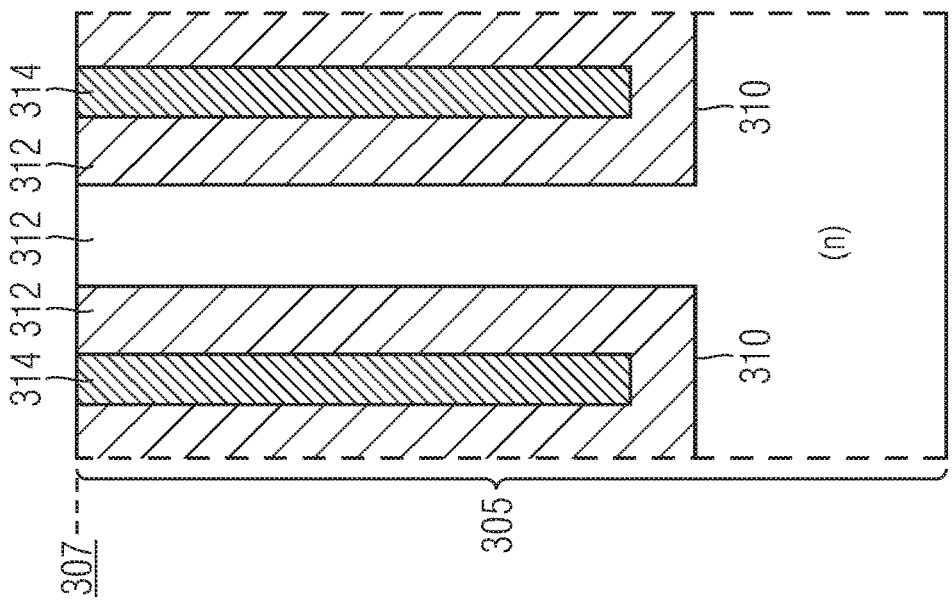

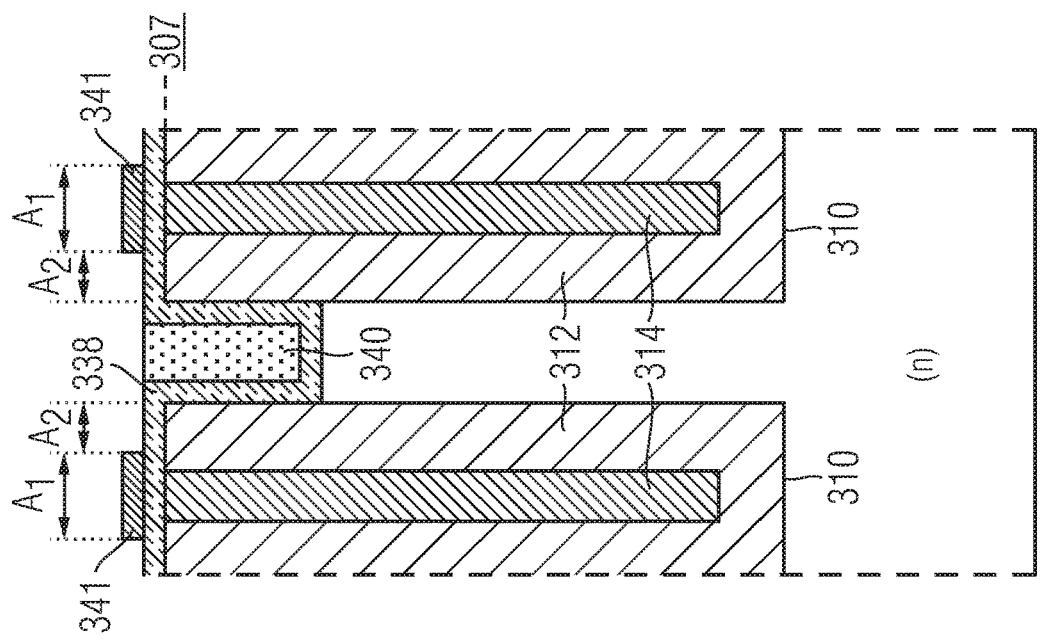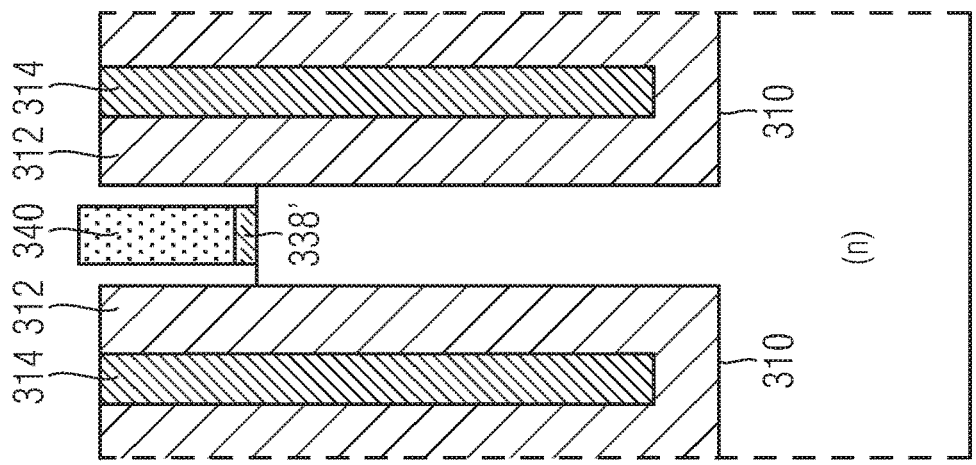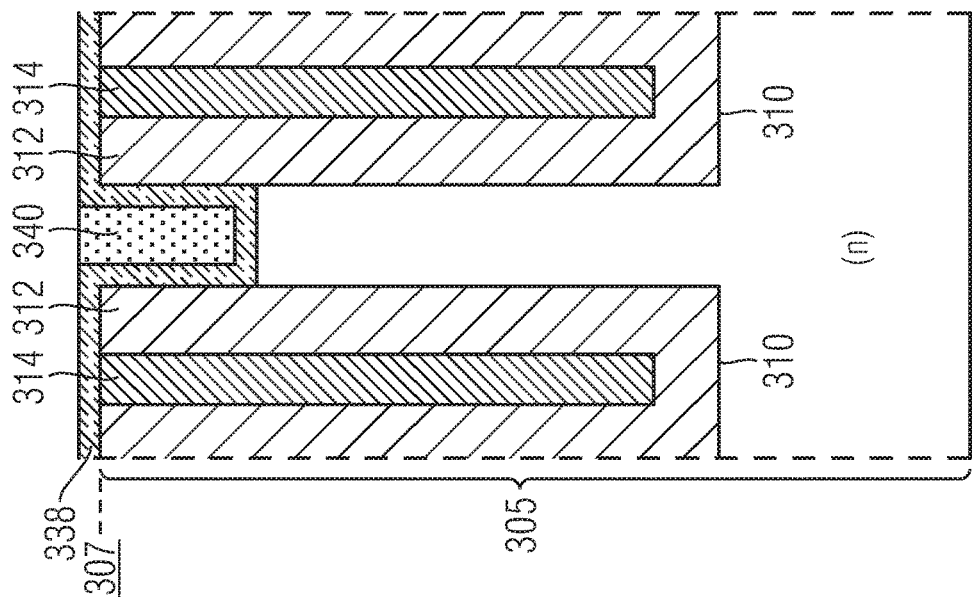

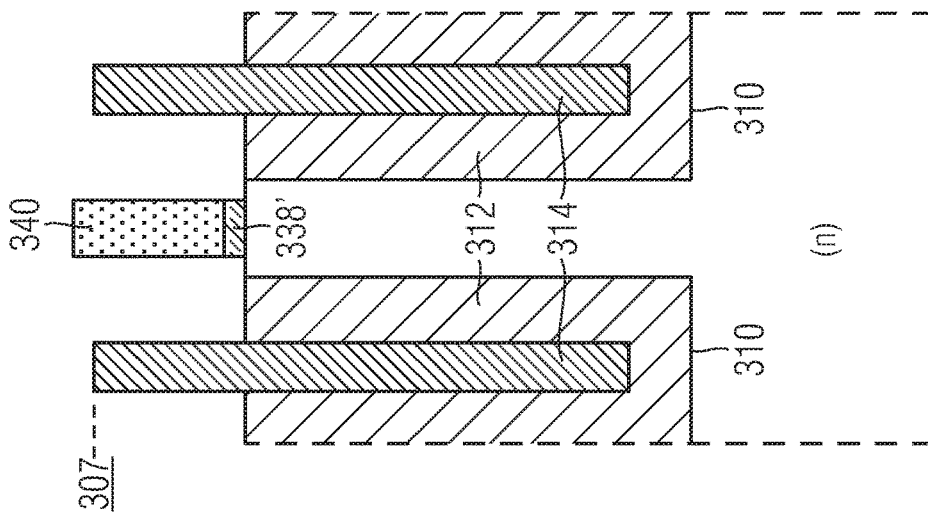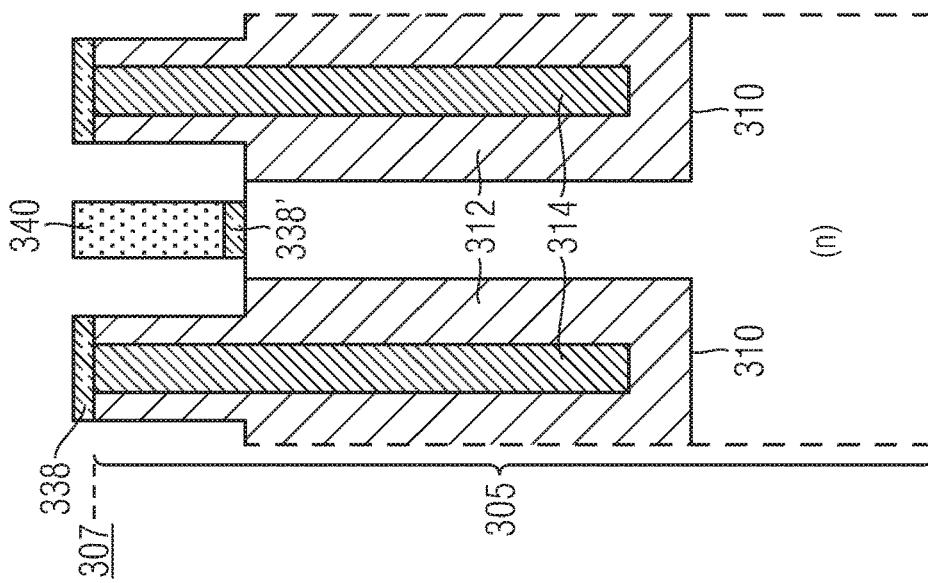

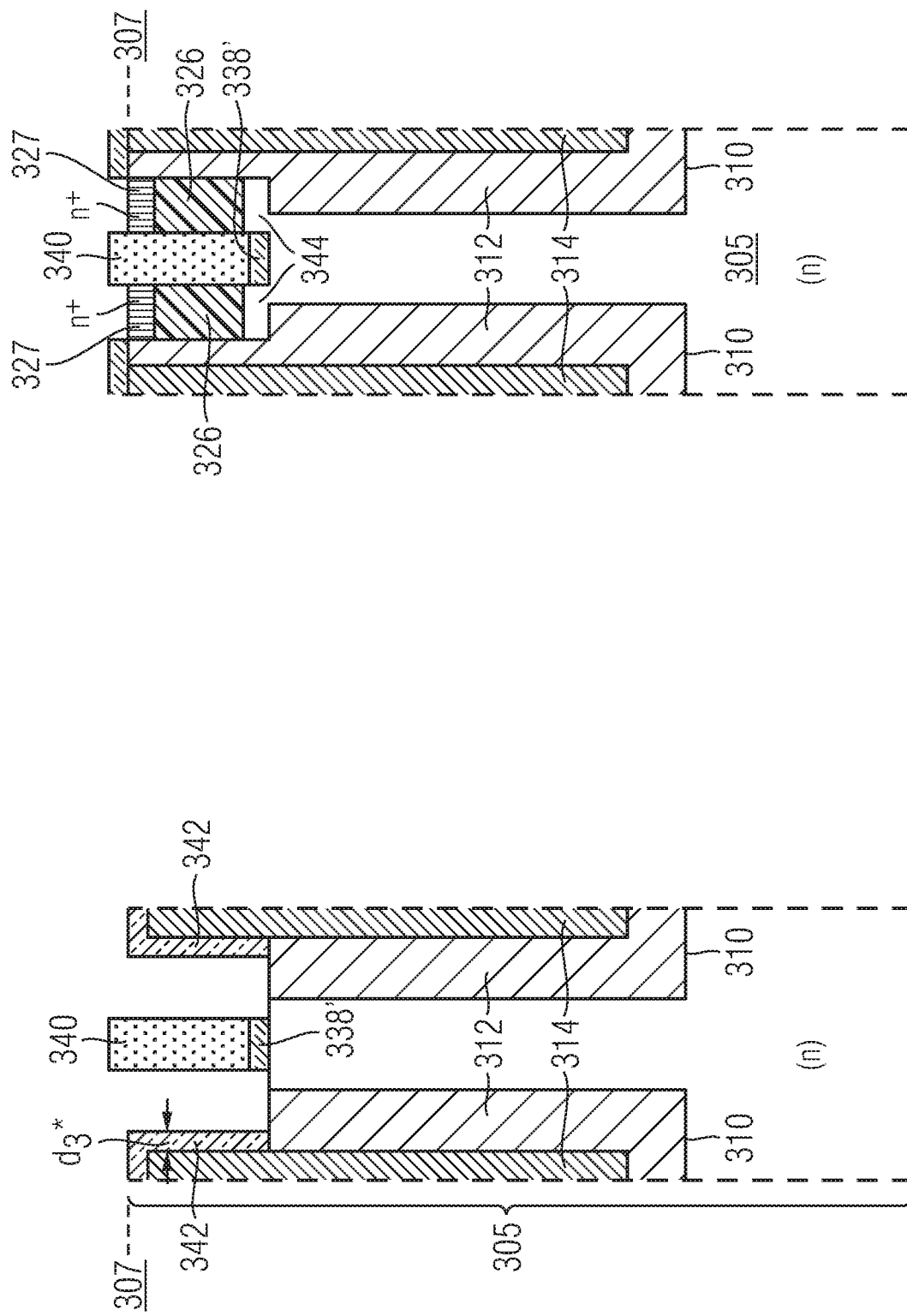

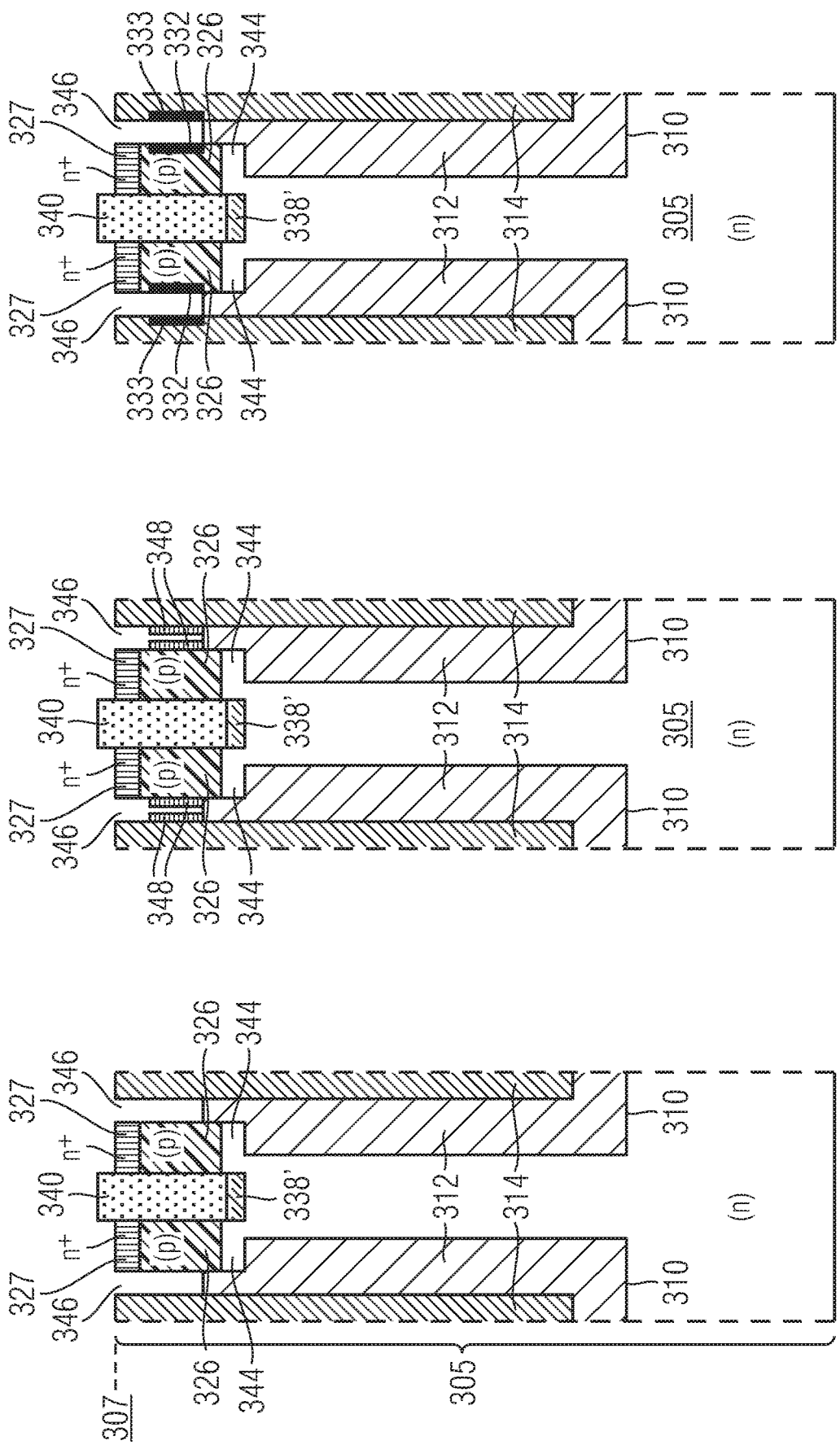

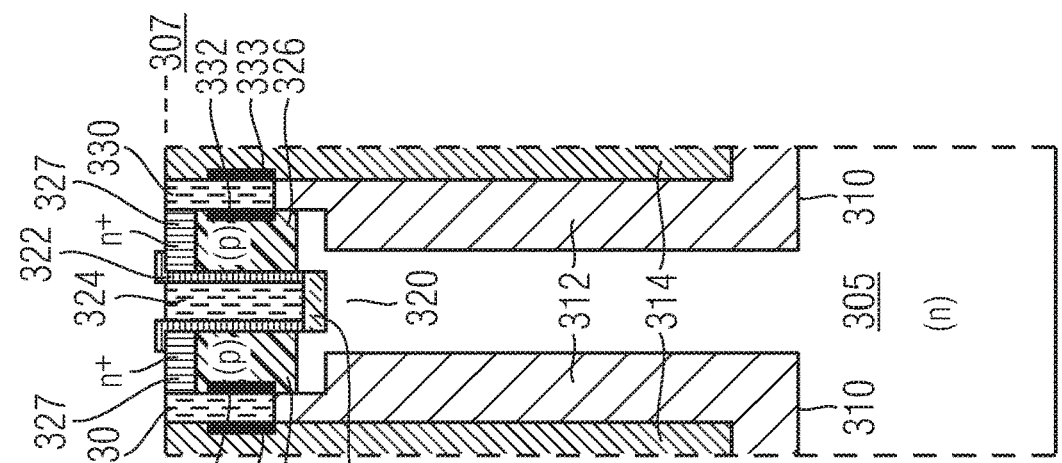
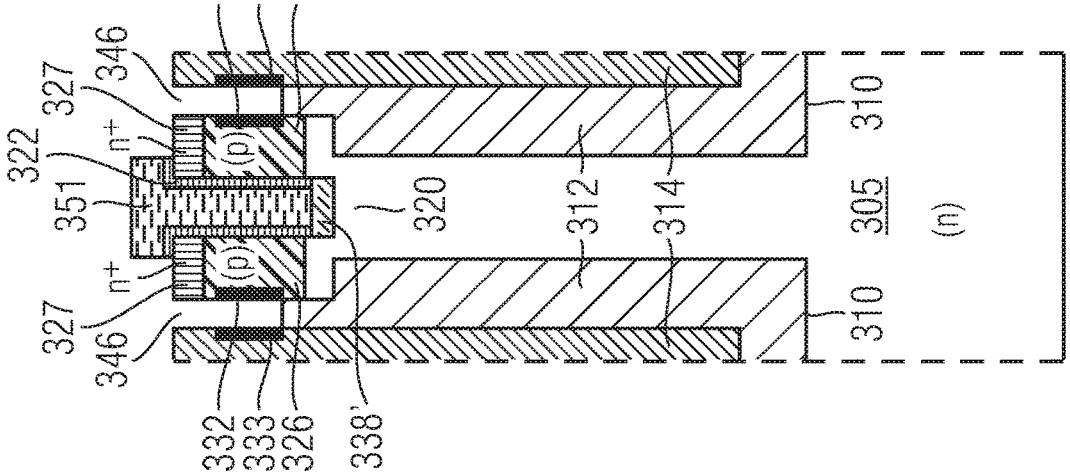
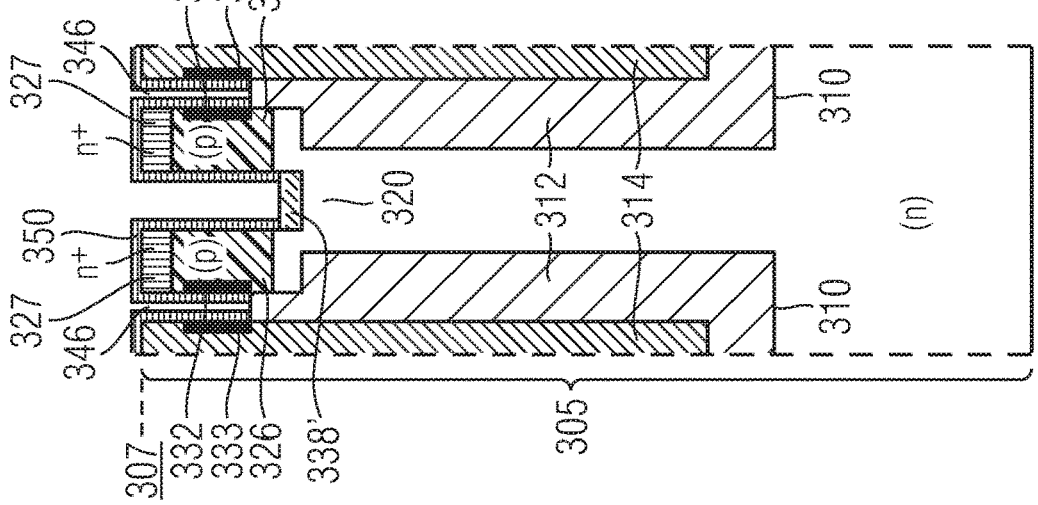

SEMICONDUCTOR DEVICE INCLUDING A GATE TRENCH AND A SOURCE TRENCH

RELATED APPLICATIONS

This application is a divisional of and claims priority to U.S. application Ser. No. 13/856,689 filed on Apr. 4, 2013. The content of said application is incorporated by reference herein in its entirety.

BACKGROUND

One goal in the development of semiconductor components such as power semiconductor components lies in an improvement of the so-called specific on-resistance being the product of the on-resistance and the area of the device (Ron×A). Owing to the need to reduce dimensions of a transistor cell while improving or maintaining the on-resistance of the transistor cell, there is a risk of crosstalk between adjacent transistor cells and their respective contact regions taking place as a result of the confine spatial proximity, which can adversely effect the operational reliability of the individual semiconductor component or of an entire integrated circuit.

Thus, there is a need for a semiconductor device which, among other advantages and features, exhibits a reduced specific on-resistance.

SUMMARY

In accordance with an embodiment, a semiconductor device includes a source trench extending into a semiconductor body from a first surface of the semiconductor body. A source trench dielectric and a source trench electrode are in the source trench. A gate trench dielectric and a gate trench electrode are in a gate trench extending into the semiconductor boy from the first surface. A body region of a first conductivity type is between the gate and source trenches. A source region of a second conductivity type different from the first conductivity type is between the gate and source trenches. An interconnection electrically couples the body region and the source trench electrode. The interconnection adjoins a lateral face of the source trench electrode and the body region. A source contact is on the source trench electrode at the first surface.

In accordance with another embodiment, a method of manufacturing a semiconductor device includes forming a source trench extending into a semiconductor body from a first surface of the semiconductor body. A source trench dielectric and a source trench electrode are formed in the source trench. A gate trench dielectric and a gate trench electrode are formed in a gate trench extending into the semiconductor body from the first surface. A body region of a first conductivity type is formed between the gate and source trenches. A source region of a second conductivity type different form the first conductivity type is formed between the gate and source trenches. The method further includes forming an interconnection electrically coupling the body region and the source trench electrode, wherein the interconnection adjoins a lateral face of the source trench electrode. A source contact is formed on the source trench electrode at the first side.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3A is a schematic cross-sectional view of a semiconductor body for illustrating a method of manufacturing a semiconductor device according to an embodiment after forming source trenches extending into the semiconductor body from a first surface.

FIG. 3B is a schematic cross-sectional view of the semiconductor body of FIG. 3B after forming a first recess in the semiconductor body between the source trenches.

FIG. 3C is a schematic cross-sectional view of the semiconductor body of FIG. 3B after forming an insulating layer lining sidewalls and a bottom side of the first recess.

FIG. 3D is a schematic cross-sectional view of the semiconductor body of FIG. 3C after filling the first recess with a dummy material.

FIG. 3E is a schematic cross-sectional view of the semiconductor body of FIG. 3D after removing the insulating layer between the dummy material and each of the source trenches according to a first process example.

FIG. 3F is a schematic cross-sectional view of the semiconductor body of FIG. 3D after forming a mask on the first surface of the semiconductor body according to a second process example.

FIG. 3G is a schematic cross-sectional view of the semiconductor body of FIG. 3F after removing the insulating layer and a part of a source trench dielectric between the dummy material and each of the source trenches according to the second process example.

FIG. 3H is a schematic cross-sectional view of the semiconductor body of FIG. 3D after removing the insulating layer and the source trench dielectric between the dummy material and each of the source trenches according to a third process example.

FIG. 3I is a schematic cross-sectional view of the semiconductor body of FIG. 3H after forming an insulating layer on an exposed surface of a source trench electrode and on an exposed surface of the semiconductor body according to the second process example.

FIG. 3J is a schematic cross-sectional view of the semiconductor body of FIG. 3I after removing the insulating layer from a top side of the semiconductor body while maintaining a part of the insulating layer surrounding the source trench electrode according to the third process example.

FIG. 3K is a schematic cross-sectional view of the semiconductor body of FIG. 3G after forming body and source regions in a semiconductor layer between the dummy material and each of the source trenches.

FIG. 3L is a schematic cross-sectional view of the semiconductor body of FIG. 3K after forming a recess between the semiconductor layer and each of source trench electrodes.

FIG. 3M is a schematic cross-sectional view of the semiconductor body of FIG. 3L after forming a dopant source at lateral faces of each of the source trench electrodes and the body regions.

FIG. 3N is a schematic cross-sectional view of the semiconductor body of FIG. 3M after introducing dopants from the dopant source into the surrounding source trench electrodes and body regions and after removing the dopant source.

FIG. 3O is a schematic cross-sectional view of the semiconductor body of FIG. 3N after forming a self-aligned gate trench by removing the dummy material and forming a gate insulating layer on an exposed surface of the semiconductor layer and each of the source trench electrodes.

FIG. 3P is a schematic cross-sectional view of the semiconductor body of FIG. 3O after forming a mask in and above the gate trench and removing the gate insulating layer in an area outside of the gate trench.

FIG. 3Q is a cross-sectional view of the semiconductor body of FIG. 3P after forming an interconnection between the source trench electrodes and the body regions.

DETAILED DESCRIPTION

Figure 1:
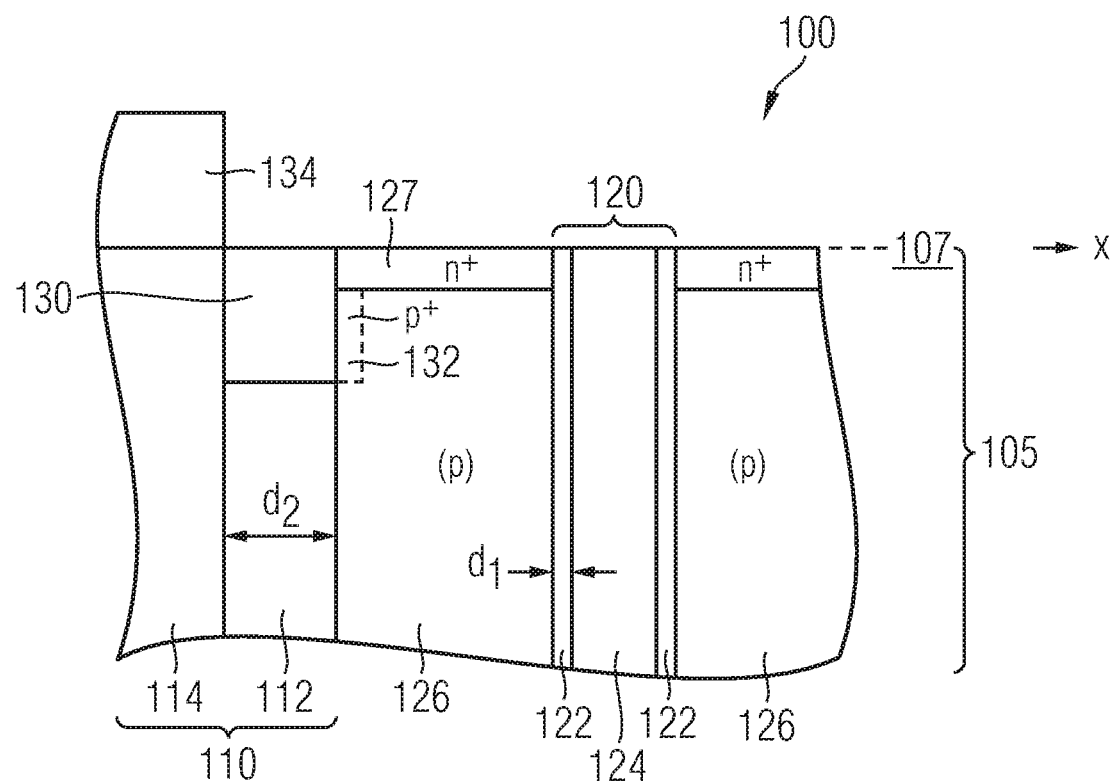
FIG. 1 is a schematic cross-sectional view of a portion of a semiconductor device in accordance with an embodiment.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration, which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. A doping type of semiconductor regions illustrated in the drawings may also be vice versa, i.e. a p-doped region may be n-doped and an n-doped region may be p-doped.

FIG. 1 illustrates a schematic cross-sectional view through a portion of a semiconductor body 105 of a semiconductor device 100. The semiconductor body 105 includes a single-crystalline semiconductor material. According to an embodiment, the semiconductor material is one of silicon (Si), silicon carbide (SiC), germanium (Ge) or a silicon-germanium compound (SiGe). According to other embodiments, the single-crystalline semiconductor material may be gallium nitride GaN or gallium arsenide GaAs, for example. On the single-crystalline semiconductor substrate, one of more optional semiconductor layer(s) may be formed, e.g. by epitaxial growth, for example.

At a first surface 107 of the semiconductor body 105 a source trench 110 extends into the semiconductor body 105. The source trench 110 includes a source trench dielectric 112 and a source trench electrode 114. According to an embodiment the source trench dielectric includes one or a stack of an oxide, e.g. SiO$_2$, a nitride, e.g. Si$_3$N$_4$, a low-k dielectric. Manufacturing of the source trench dielectric 112 may include thermal processing, e.g. thermal oxidation and/or deposition techniques, e.g. chemical vapor deposition such as low pressure CVD (LPCVD) and plasma enhanced CVD (PECVD), for example. The source trench electrode 114 may include one or a plurality of conducting materials, e.g. a stack of conducting layers. According to one embodiment, the source trench electrode includes or consists of highly doped polysilicon material. In addition to doped semiconductor material, the source trench electrode 114 may include or consist of metal or metal compound.

The semiconductor device 100 further includes a gate trench 120 extending into the semiconductor body 105 from the first surface 107. The gate trench 120 includes a gate trench dielectric 122, e.g. thermal SiO$_2$ and a gate electrode 124 including one or a plurality of conducting materials similar to the materials described with respect to the source trench electrode 114 above. According to an embodiment, a thickness $d_1$ of the gate trench dielectric 122 is smaller than a thickness $d_2$ of the source trench dielectric 112, i.e. $d_1 < d_2$. The thickness $d_1$ may range between 20 nm and 200 nm for the material SiO$_2$. The thickness $d_2$ of the source trench dielectric 112 may range between 0.05 μm and 5 μm for the material SiO$_2$, for example.

A p-doped body region 126 is located between the source trench 110 and the gate trench 120. Likewise, an $n^+$-doped source region 127 is located between the gate trench 120 and the source trench 110.

An interconnection 130 electrically couples the p-doped body region 126 and the source trench electrode 114. The interconnection 130 includes one or a plurality of conducting materials such as doped semiconductor materials, metals and metal compounds and any combination thereof. According to one embodiment, the interconnection 130 includes or consists of $p^+$-doped polysilicon. According to another embodiment, the interconnection 130 includes or consists of a stack of metal and/or metal compounds, e.g. a stack of Ti/TiN/W. Additional layers for improving an ohmic contact to the source trench electrode 114 and/or the p-doped body region 126 may be formed. As an example, an optional $p^+$-doped body contact region 132 is arranged between the interconnection 130 and the p-doped body region 126. In addition or as an alternative to the optional $p^+$-doped body contact region 132, silicide layer(s), e.g. titanium silicide ($TiSi_2$) and/or metal nitride layers, e.g. titanium nitride (TiN) may be used for improving the ohmic contact.

The semiconductor device 100 may be a trench structure transistor, e.g. a trench field effect transistor (trench FET), a trench insulated gate bipolar transistor (trench IGBT) and may include a super-junction structure of alternating p-doped and n-doped areas for improving a trade-off between on-state resistance and voltage blocking capability. According to one embodiment, the semiconductor device 100 is a discrete semiconductor. According to another embodiment, the semiconductor device 100 is an integrated circuit including additional circuit elements, e.g. resistors, capacitors, diodes, bipolar transistors and/or FETs.

A source contact 134, e.g. a contact plug or a contact line provides electrical contact to the source trench electrode 114 at the first surface 107. The source contact 134 includes one or a plurality of conducting materials such as doped semiconductor material(s) and/or metal(s)/metal compound(s), e.g. highly doped Si, Al, silicides such as $TiSi_2$, $WSi_2$, $CoSi_2$, TiN, TaN, W, Cu and any combination thereof.

In the semiconductor device 100, a lateral electrical coupling between the source trench electrode 114 and the p-doped body region 126 by the interconnection 130 allows for a compact transistor cell design. As an example, there is no need for a contact opening directly above the source region 127. In the semiconductor device 100, the source region 127 can be electrically coupled to a source terminal via the interconnection 130, the source trench electrode 114 and the source contact 134.

Although there is no need for an overlap between the source contact 134 and the $n^+$-doped source region 127, a slight overlap by less than 100 nm along a lateral direction x extending between the gate and source trenches 120, 110 parallel to the first surface 107 may exist, e.g. due to process-technical reasons.

The contact transistor cell layout of the embodiment illustrated in FIG. 1 allows for an improvement of the specific on-resistance.

Figure 2:
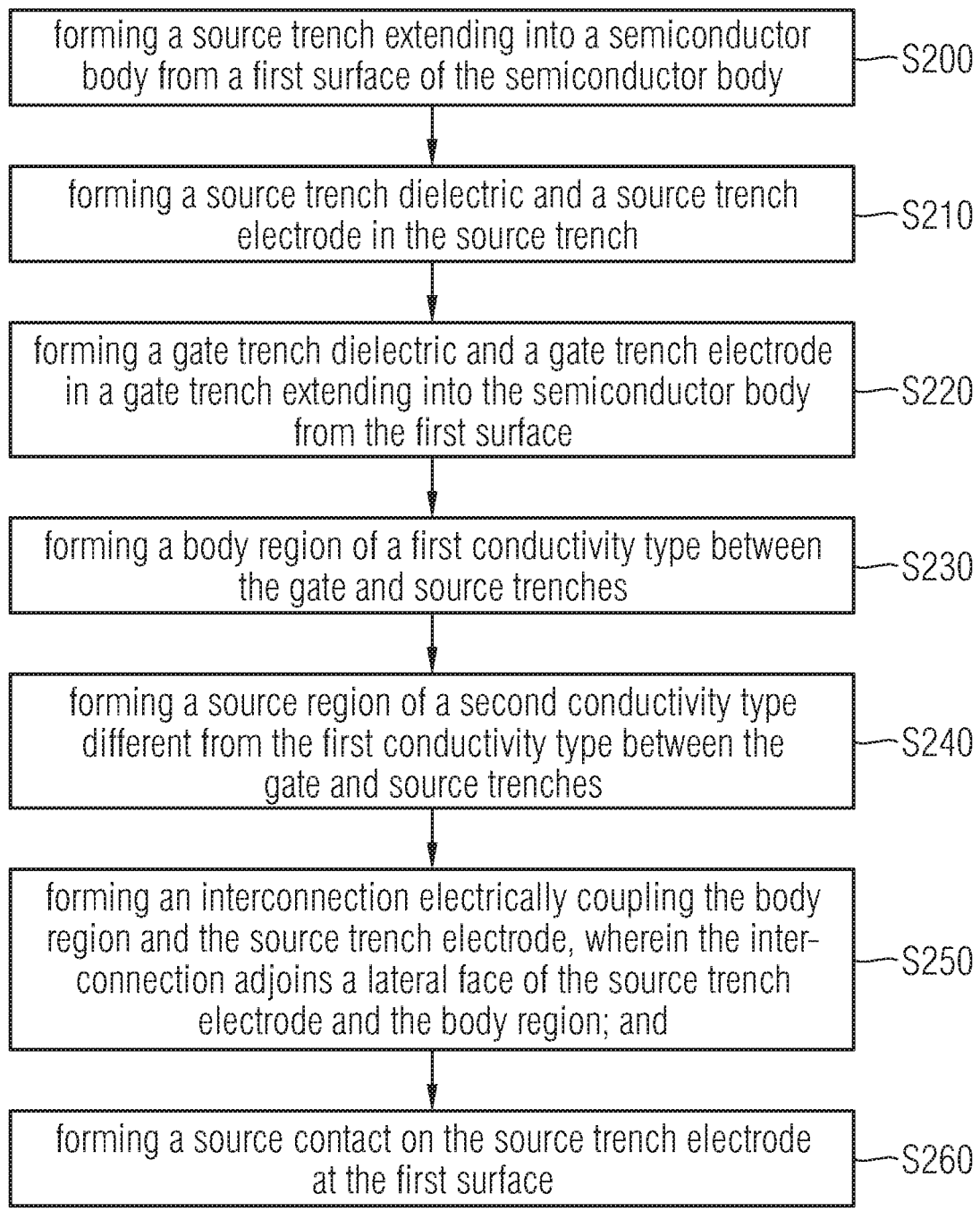
FIG. 2 is a schematic flowchart of a method of manufacturing a semiconductor device in accordance with an embodiment.

FIG. 2 illustrates a schematic process flow in accordance with an embodiment of manufacturing a semiconductor device.

Process feature S200 includes forming a source trench extending into a semiconductor body from a first surface of the semiconductor body. According to an embodiment, the source trench is etched into the semiconductor body using an appropriate etch mask on the first surface.

Process feature S210 includes forming a source trench dielectric and a source trench electrode in the source trench. The source trench dielectric may be formed by thermal processing, e.g. thermal oxidation and/or layer deposition of dielectric material(s) such as an oxide, a nitride and/or a low-k dielectric. The source trench electrode may be formed by filling the source trench with one or more conducting material(s) such doped semiconductor material(s) and/or metal(s)/metal compound(s). According to one embodiment, the source trench electrode includes or consists of highly doped polysilicon.

Process feature S220 includes forming a gate trench dielectric and a gate trench electrode in the gate trench extending into the semiconductor body from the first surface of the semiconductor body. The gate trench dielectric may be formed by thermal processing, e.g. thermal oxidation and/or layer deposition of dielectric material(s) such as an oxide, a nitride and/or a low-k dielectric. The gate trench electrode may be formed by filling the gate trench with one or more conducting material(s) such doped semiconductor material(s) and/or metal(s)/metal compound(s). According to one embodiment, the gate trench electrode includes or consists of highly doped polysilicon.

Process feature S230 includes forming a body region of a first conductivity type between the gate and source trenches. According to an embodiment, the body region is formed by in-situ doping during epitaxial growth. This allows to approach a box-like body dopant profile and, thus, to reduce variations in a threshold voltage. According to another embodiment or in addition to in-situ doping, dopants of the body region may be introduced by ion implantation.

Process feature S240 includes forming a source region of a second conductivity type different from the first conductivity type between the gate and source trenches. According to an embodiment, the source region is formed by ion implantation of dopants and/or diffusions of dopants into the semiconductor body.

Process feature S250 includes forming an interconnection electrically coupling the body region and the source trench electrode, wherein the interconnection adjoins a lateral face of the source trench electrode and of the body region. According to one embodiment, the interconnection is formed by filling a recess with one or more conduction material(s). The conducting material adjoins the lateral face of the source trench electrode and of the body region. Additional layers for improving an ohmic contact to the source trench electrode and/or the body region may be formed, e.g. a body contact zone and/or a silicide layer, e.g. $TiSi_2$ and/or a metal nitride layer, e.g. TiN.

Process feature S260 includes forming a source contact on the source trench electrode at the first surface. According to an embodiment, the source contact is formed by forming contact openings in an interlayer dielectric on the first surface and filling the contact opening with one or more conducting material(s) extending to a top side of the source trench electrode.

The processes described above with respect to process features S200 to S260 can be carried out in arbitrary sequence provided that such a process flow can be integrated in a manufacturing process flow. As an example, the gate dielectric and the gate electrode may be manufactured after formation of the body region and the source region. Some of the processes may be carried out simultaneously and/or be applied to other areas of the semiconductor body. Additional processes may be carried out before, between or after the processes described above with respect to process features S200 to S260.

Figure 3R:
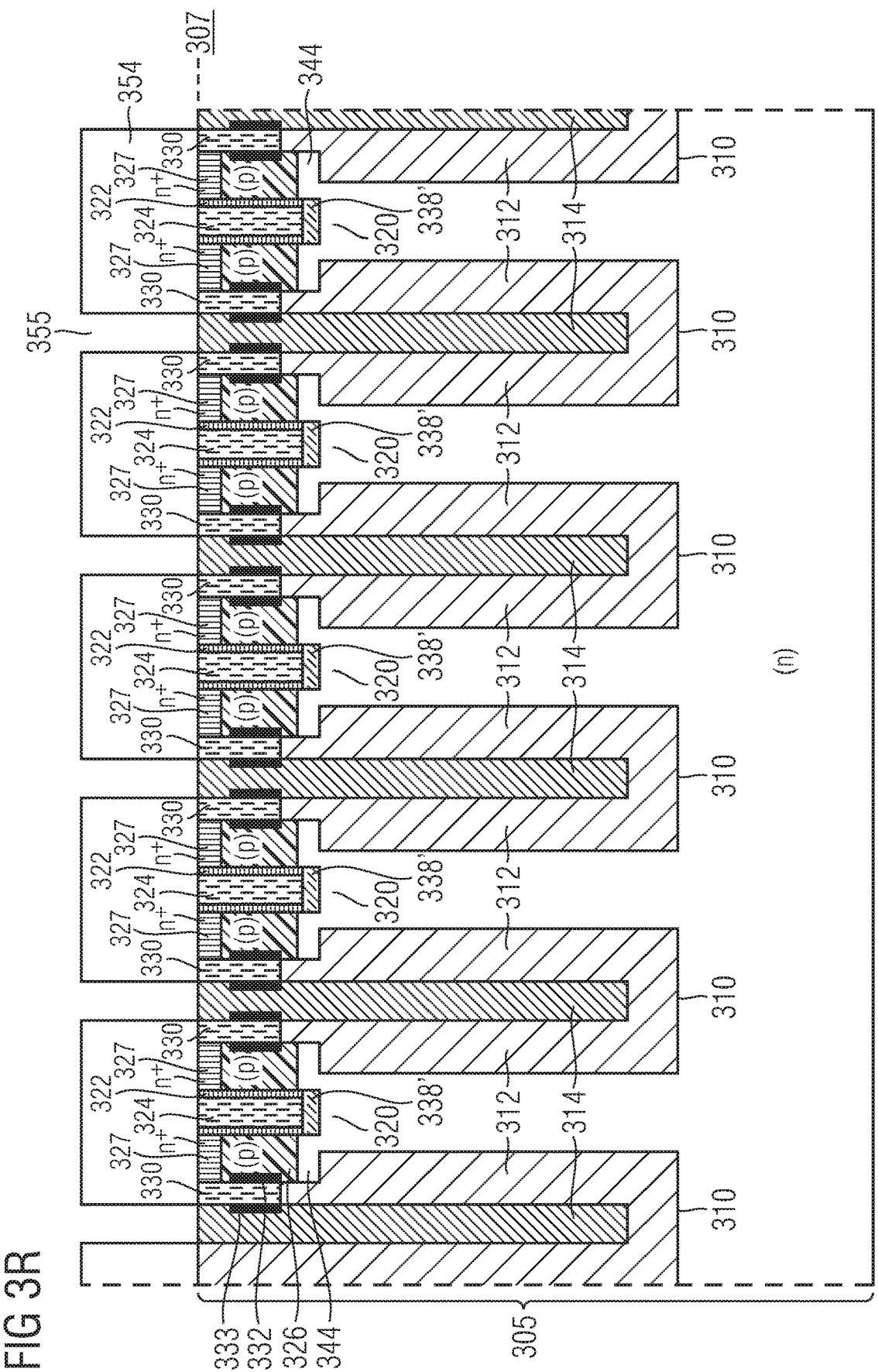
FIG. 3R is an enlarged cross-sectional view of the semiconductor body of FIG. 3Q after forming an insulating layer on the first surface and after forming contact openings in the insulating layer extending to a top side of the source trench electrodes.
Figure 3S:
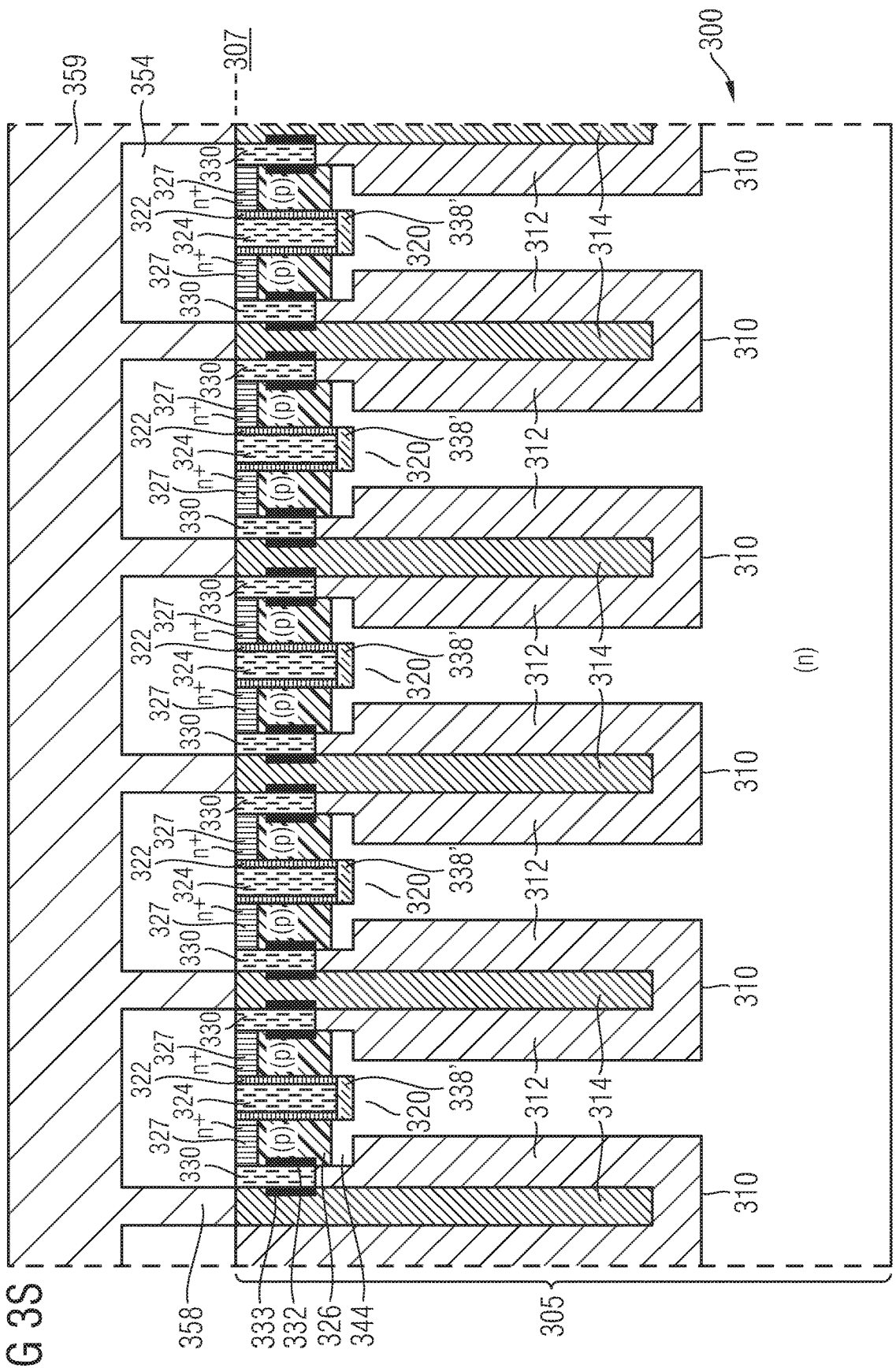
FIG. 3S is a schematic cross-sectional view of the semiconductor body of FIG. 3R after filling the contact openings with a conducting material and interconnecting the source trench electrodes by a conductive layer.

FIGS. 3A to 3S illustrate cross-sectional views of a semiconductor body 305 undergoing processing for manufacturing a semiconductor device according to an embodiment.

Referring to the cross-sectional view of the semiconductor body 305 illustrated in FIG. 3A, source trenches 310 are formed in the semiconductor body 305 at a first surface 307, e.g. by an anisotropic etch process such as dry etching. A source trench dielectric 312 is formed in the source trenches 310, e.g. by a thermal process and/or layer deposition and lines sidewalls and a bottom side of the source trenches 310. The source trenches 310 are then filled with a source trench electrode 314 by depositing and/or growing conducting material(s) in the source trenches 310. According to an embodiment, the source trench electrode 314 includes or consists of highly doped polysilicon. A process of smoothing surfaces and removing excess material of the source trench dielectric 312 and/or the source trench electrode 314 at the first side 307 may follow, e.g. by chemical mechanical polishing (CMP) and/or etching.

Referring to the schematic cross-sectional view of the semiconductor body 305 illustrated in FIG. 3B, a recess 336 is formed between the source trenches 310. According to an embodiment, the recess 336 is formed by etching a material of the semiconductor body 305, e.g. Si selectively with respect to a material of the source trench dielectric 312. In case etching of the semiconductor body 305 cannot be carried out selectively with respect to the source trench electrode 314, e.g. in case the semiconductor body 305 is made of silicon and the source trench electrode 314 is made of polysilicon, a mask, e.g. a hard mask such as an oxide and/or a resist mask may cover a topside of the source trench electrode 314 while etching the first recess 336 into the semiconductor body 305.

Referring to the schematic cross-sectional view of the semiconductor body 305 illustrated in FIG. 3C, an insulating layer 338 is formed at the first surface 307 of the semiconductor body 305 and lines sidewalls and a bottom side of the first recess 336. The insulating layer 338 may be formed by depositing one or a stack of insulating materials, e.g. by LPCVD for achieving a conformal etch coverage.

Referring to the schematic cross-sectional view of the semiconductor body 305 illustrated in FIG. 3D, a dummy material 340 is filled in the first recess 336. A recess process may follow for smoothing the first surface 307 and removing excess dummy material from the first surface 307. The dummy material 340 is configured to be selectively removed with respect to the insulating layer 338 and, optionally, with respect to the source trench dielectric 312. As an example, the dummy material may include or consist of carbon and/or nitride for achieving etch selectivity with regard to an insulating layer including or consisting of an oxide such as $SiO_2$ and a source trench dielectric including or consisting of an oxide such as $SiO_2$, for example.

Referring to the schematic cross-sectional view of the semiconductor body 305 illustrated in FIG. 3E, the insulating layer 338 is selectively removed with respect to the dummy material 340 up to a bottom side of the first recess. A bottom dielectric 338' as part of the insulating layer 338 remains between the semiconductor body 305 and a bottom side of the dummy material 340. By adjusting a thickness of the insulating layer 338, a gate-drain charge Qgd can be reduced. Removal of the insulating layer 338 between the dummy material 340 and the source trench dielectric 312 is a first example of processing the semiconductor body 305. A second example of processing the semiconductor body 305 is illustrated with reference to FIGS. 3F to 3G.

Referring to the schematic cross-sectional view of the semiconductor body 305 illustrated in FIG. 3F, a mask 341, e.g. a hard mask or a resist mask is formed on the first surface 307. The mask 341 covers only a first part $A_1$ of the source trench dielectric 312 leaving a second part $A_2$ of the source trench dielectric 312 uncovered. The second part $A_2$ is located between the insulating layer 338 and the first part $A_1$.

Referring to the schematic cross-sectional view of the semiconductor body 305 illustrated in FIG. 3G, the insulating layer 338 which is not covered by the mask 341 and the second part A2 of the source trench dielectric 312 are selectively removed with respect to the dummy material 340 up to a bottom side of the first recess, e.g. by a selective etch process. A bottom dielectric 338' as part of the insulating layer 338 remains between the semiconductor body 305 and a bottom side of the dummy material 340. By adjusting a thickness of the insulating layer 338, a gate-drain charge Qgd can be reduced. Removal of the insulating layer 338 and a part of the source trench dielectric 312 between the dummy material 340 and the source trench dielectric 312 is a second example of processing the semiconductor body 305. The second process example allows for an increase in a width of a recess formed between the dummy material 340 and the source trenches 310. The width of the recess determines the width of a mesa region to be formed in the recess at a later stage of processing.

FIGS. 3H to 3J refer to a third example of processing the semiconductor body 305.

Referring to the schematic cross-sectional view of the semiconductor body 305 illustrated in FIG. 3H, the insulating layer 338 and the source trench dielectric 312 are selectively removed with respect to the dummy material 340 and the source trench electrode 314 up to a bottom side of the first recess. Thereby, an upper part of the source trench electrode 312 is exposed. A bottom dielectric 338' as part of the insulating layer 338 remains between the semiconductor body 305 and a bottom side of the dummy material 340. By adjusting a thickness of the insulating layer 338, a gate-drain charge Qgd can be reduced. Removal of the insulating layer 338 and the source trench dielectric 312 between the dummy material 340 and the source trench dielectric 312 is a third example of processing the semiconductor body 305.

Referring to the schematic cross-sectional view of the semiconductor body 305 illustrated in FIG. 3I, an insulating layer 342 is formed on the exposed part of the source trench electrode 314 and on an exposed part of the semiconductor body 305 next to the bottom dielectric 338'. According to an embodiment, the insulating layer 342 is formed by thermal wet oxidation. When forming the source trench electrode 314 of polysilicon and the semiconductor body 305 of crystalline silicon, thermal wet oxidation at low temperatures leads to an oxide surrounding the exposed part of the source trench electrode including a thickness $d_3$ that is larger than a thickness $d_4$ of an oxide on the semiconductor body 305 next to the bottom dielectric 338'.

Referring to the schematic cross-sectional view of the semiconductor body 305 illustrated in FIG. 3J, the insulating layer 342 on the semiconductor body 305 is removed, e.g. by an etch process. The etch process leads to a reduction of the thickness of the insulating layer 342 from $d_3$ to $d_3^*$. Hence, the source trench electrode 314 remains covered by the insulating layer 342 while the insulating layer 342 is removed on the semiconductor body 305 next to the bottom dielectric 338'. The third process example allows for a further increase of a width of the recess between the dummy material 340 and the source trenches 310. A width of a mesa region to be formed in the recess at a later stage of processing can thus be enlarged compared to processing according to the first and second process examples.

In the following, further processing of the semiconductor body 305 will be described with reference to the second process example illustrated in FIGS. 3F and 3G. Processing of the semiconductor body 305 as described below can also be carried out based on the first and third process examples described above.

Referring to the schematic cross-sectional view of the semiconductor body 305 illustrated in FIG. 3K, a semiconductor layer 344 is formed on the semiconductor body 305 between the dummy material 340 and the source trenches 310. According to an embodiment, a p-doped body region 326 is formed while growing and/or depositing the semiconductor layer 344 by in-situ doping. When doping the body region 326 in-situ, a pn junction between the body region 326 and the semiconductor layer 344 below can be self-aligned with respect to a bottom side of the dummy material 340 which is replaced by a gate electrode at a later stage of processing. Furthermore, by doping the body region 326 in-situ, a profile of dopants of the body region 326 can be adjusted box-shaped allowing for a reduction of fluctuations of the threshold voltage. According to another embodiment, the p-doped body region 326 is formed by ion implantation after formation of the semiconductor layer 344. An $n^+$-doped source region 327 is formed in the semiconductor layer 344 at the first surface 307 by introducing n-type dopants through the first surface 307 into the semiconductor layer 344, e.g. by ion implantation and/or diffusion.

Referring to the schematic cross-sectional view of the semiconductor body 305 illustrated in FIG. 3L, a recess 346 is formed between the p-doped body region 326 and the source trench electrodes 314, e.g. by lithography and etching such as anisotropic etching by dry etch processing. According to an embodiment, a bottom side of the recess 346 ends above a bottom side of the p-doped body region 326.

Referring to the schematic cross-sectional view of the semiconductor body 305 illustrated in FIG. 3M, a dopant source 348 is formed at lateral faces of the source trench electrodes 314 and of the p-doped body region 326. According to an embodiment, formation of the dopant source 348 includes deposition of a borosilicate glass layer (BSG layer) and a partial removal of the BSG layer by a spacer etch process exposing the $n^+$-doped source region 327.

Referring to the schematic cross-sectional view of the semiconductor body 305 illustrated in FIG. 3N, dopants are introduced from the dopant source 348 through a later face into the p-doped body region 326, e.g. by diffusion initiated by thermal processing. The dopants introduced into the p-doped body region 326 define a $p^+$-doped body contact region 332. In a similar manner, a contact region 333 is formed at a lateral face of the source trench electrodes 314 as a byproduct of formation of the $p^+$-doped body contact region 332. After formation of the contact regions 332, 333, the dopant source 348 is removed, e.g. by an unmasked etch process such as wet etching. Formation of the contact regions 332, 333 as illustrated in FIGS. 3M and 3N is carried out by thermal diffusion out of a diffusion source. According to other embodiments, formation of the contact regions 332 and/or 333 is carried out by tilted ion implantation and/or diffusion from gas phase.

Referring to the schematic cross-sectional view of the semiconductor body 305 illustrated in FIG. 3O, the dummy material 340 is removed. Thereby, a gate trench 320 self-aligned with respect to the source trenches 310 results.

Referring to the schematic cross-sectional view of the semiconductor body 305 illustrated in FIG. 3O, a gate trench dielectric layer 350 is formed on an exposed surface of the source trench electrodes 314, of the p-doped body region 326 and of the $n^+$-doped source region 327. According to an embodiment, the gate trench dielectric layer 350 is formed by thermal oxidation and/or deposition of one or more insulating material(s).

Referring to the schematic cross-sectional view of the semiconductor body 305 illustrated in FIG. 3P, the gate trench dielectric layer 350 is removed in an area outside the gate trench 320, e.g. by photolithography for defining an etch mask 351 and etching the gate trench dielectric layer 350 outside a masked area. A gate trench dielectric 322 as part of the etched gate trench dielectric layer 350 remains in the gate trench 320. Then, the etch mask 351 is removed.

Referring to the schematic cross-sectional view of the semiconductor body 305 illustrated in FIG. 3Q, an interconnection 330 is formed in the recess 346 electrically coupling the source trench electrodes 314 and the p-doped body region 326 through a lateral face of the p-doped body region 326 and electrically coupling the source trench electrodes 314 and the source 327. The interconnection 330 is formed of one or more conducting material(s), e.g. doped semiconductor material(s) and/or metal(s)/metal compound(s). According to an embodiment, the interconnection is formed as a stack of Ti/TiN/W. The material(s) of the interconnection may simultaneously be formed in the gate trench 320 defining a gate trench electrode 324. Smoothing of the first surface 307 may follow, e.g. by carrying out CMP and/or etching.

Referring to the schematic cross-sectional view of the semiconductor body 305 illustrated in FIG. 3R, an insulating layer 354 is formed on the first surface 307 and patterned by photolithography for forming contact openings 355 in the insulating layer 354 extending to a topside of the source trench electrodes 314.

Referring to the schematic cross-sectional view of the semiconductor body 305 illustrated in FIG. 3S, the contact openings 355 are filled with conducting material(s) 358 and interconnected by a conducting layer 359. Further processes such as formation of a drain electrode at a second surface of the semiconductor body 305 opposite to the first surface 307 follow or are carried out before or between processes described with reference to the Figures above.

The semiconductor device 300 provides a number of technical benefits. A box-shaped dopant profile of the p-doped body region 326 allows for a reduction of threshold voltage fluctuations. Furthermore, the bottom dielectric 338' can be adjusted so as to reduce the gate to drain charge $Q_{gd}$. Furthermore, the pn junction between the p-doped body region 326 and the semiconductor layer 344 can be self-aligned with respect to the gate trench electrode 324 allowing for a reduction of the gate to drain charge Qgd and a reduction of fluctuations in Qgd. Benefits such as self-alignment of the gate trench 320 with respect to the source trenches 310, increase of a width of a mesa region and electrical contact to the source region 327 via the source trench electrode 314 allow for a reduction of the specific on-resistance Ron×A.

Figure 3T:
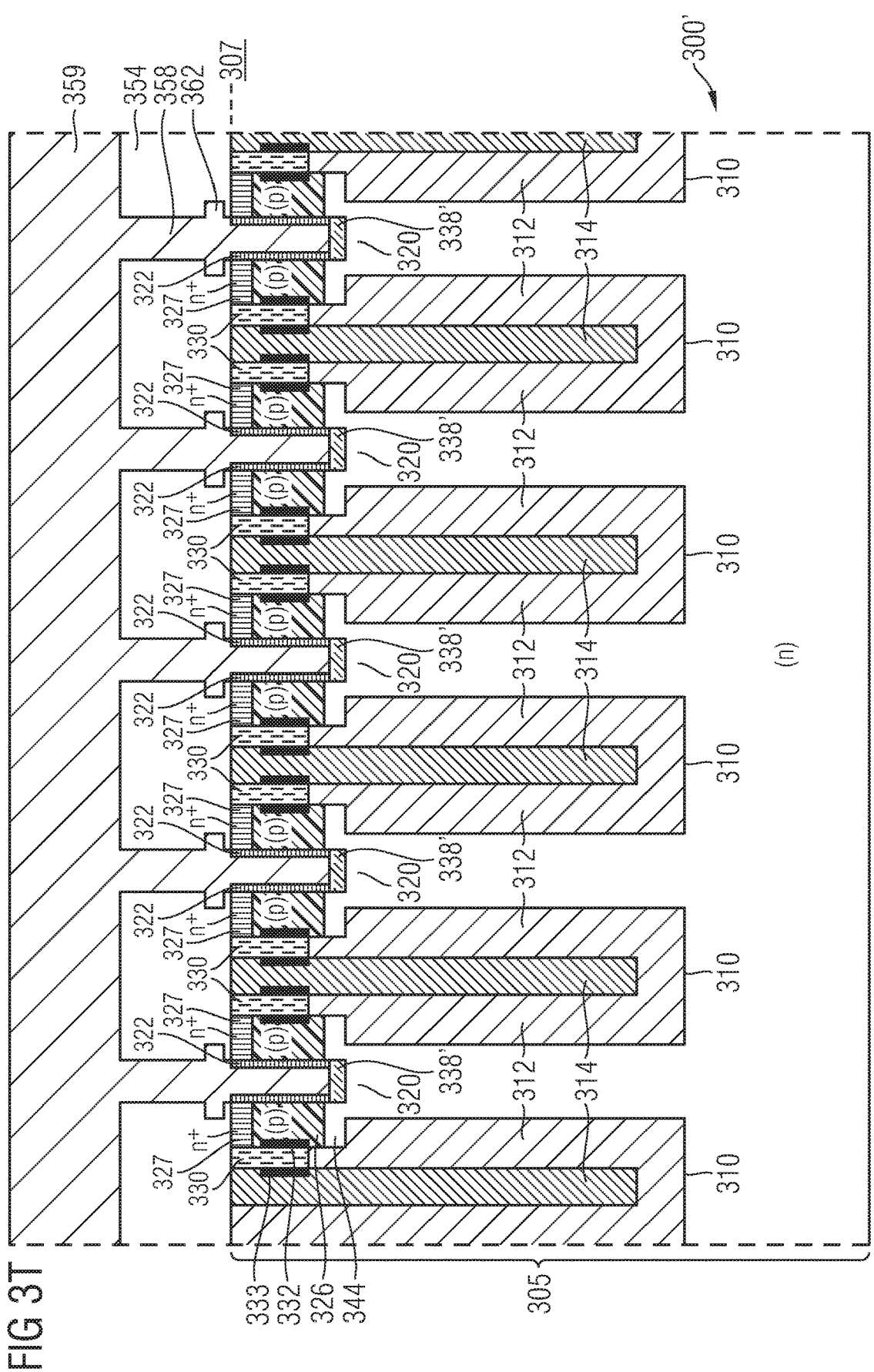
FIG. 3T is a cross-sectional view of the semiconductor body of FIG. 3S including a modification in the form of a gate pad on the gate electrode.

FIG. 3T illustrates a schematic cross-sectional view of a semiconductor device 300' including a modification with respect to the semiconductor device 300 illustrated in FIG. 3S. The modification relates to a gate contact landing pad 362 having a lateral dimension greater than the lateral dimension of the contact 358. Formation of the landing pad 362 is optional and depends up on a width of the gate trench 320.

Figure 4:
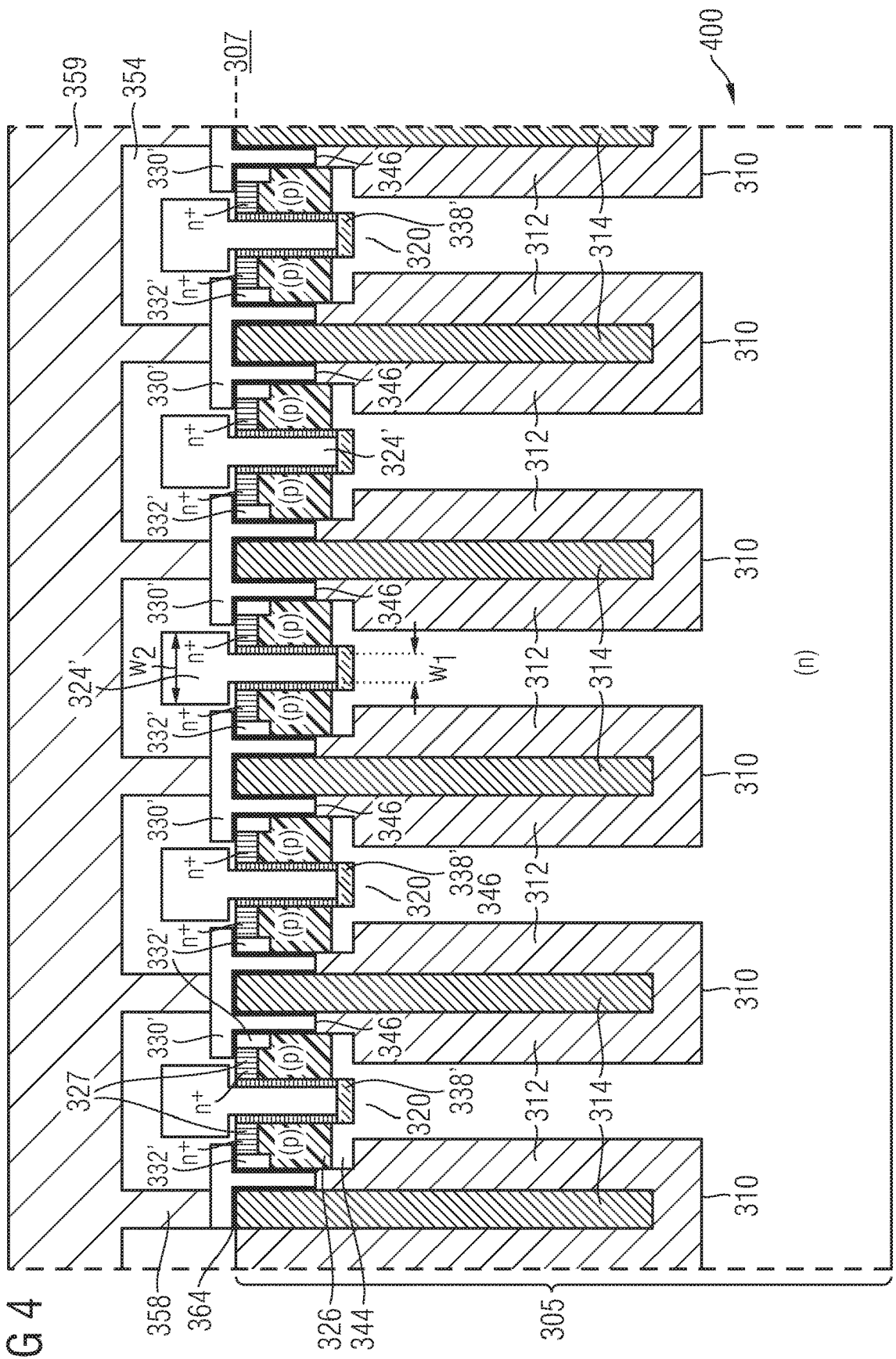
FIG. 4 is a schematic cross-sectional view of a portion of a semiconductor body in accordance with another embodiment of a semiconductor device.

FIG. 4 refers to a schematic cross-sectional view of a semiconductor device 400 including modifications with respect to the semiconductor device 300 illustrated in FIG. 3S.

The semiconductor device 400 includes a gate trench electrode 324' made of highly doped semiconductor material(s), e.g. highly doped polysilicon. The gate trench electrode 324' includes a first part within the gate trench 320 and a second part above the first surface 307. The first and second parts are merged and a width $w_1$ of the first part is smaller than a width $w_2$ of the second part. The second part of the gate trench electrode 324' allows for a reduction of a gate line resistance. Furthermore, the semiconductor device 400 includes an interconnection 330' made of highly doped semiconductor material(s), e.g. highly doped polysilicon. The interconnection 330' is not only formed within the recess 346 but also partially overlaps the first surface 307. The contact 358 ends on the interconnection 330'. A $p^+$-doped body contact region 332' and an additional contact layer 364, e.g. a silicide layer such as $TiSi_2$ improve electrical coupling between the source trench electrodes 314 and the p-doped body region 326.

Figure 5A:
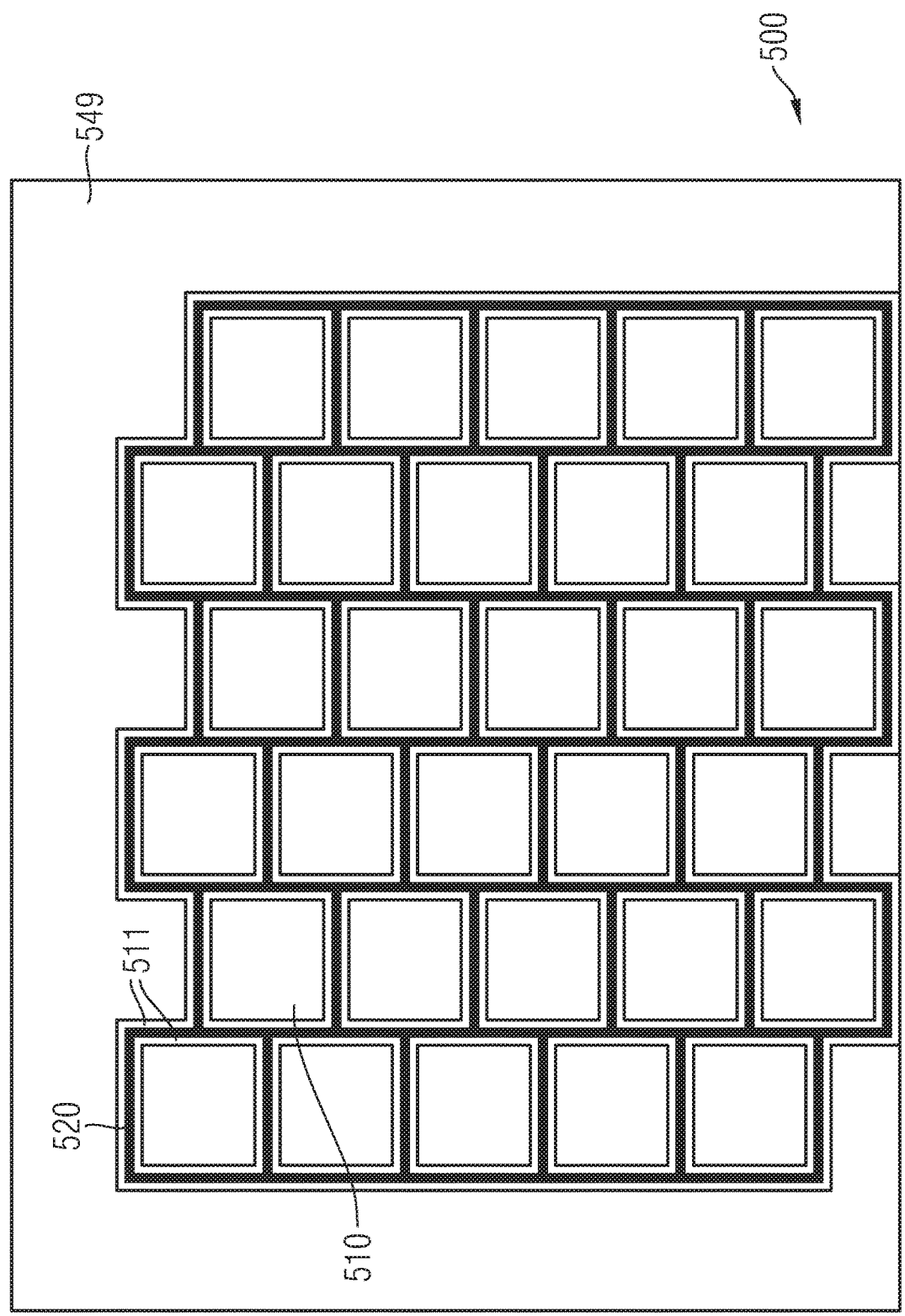
FIG. 5A is a schematic top view of a portion of a transistor cell array including distinct source trenches surrounded by a closed gate trench structure.

FIG. 5A illustrates a schematic plan view of a transistor cell array layout including distinct source trenches 510 surrounded by a closed gate trench structure 520. A mesa region 511 is located between the source trenches 510 and the gate trench structure 520. The semiconductor device 500 further includes a circumferential termination trench structure 549. Examples of the transistor cells of semiconductor device 500 in cross-sectional view are given in the embodiments described above with reference to FIGS. 1 to 4.

Figure 5B:
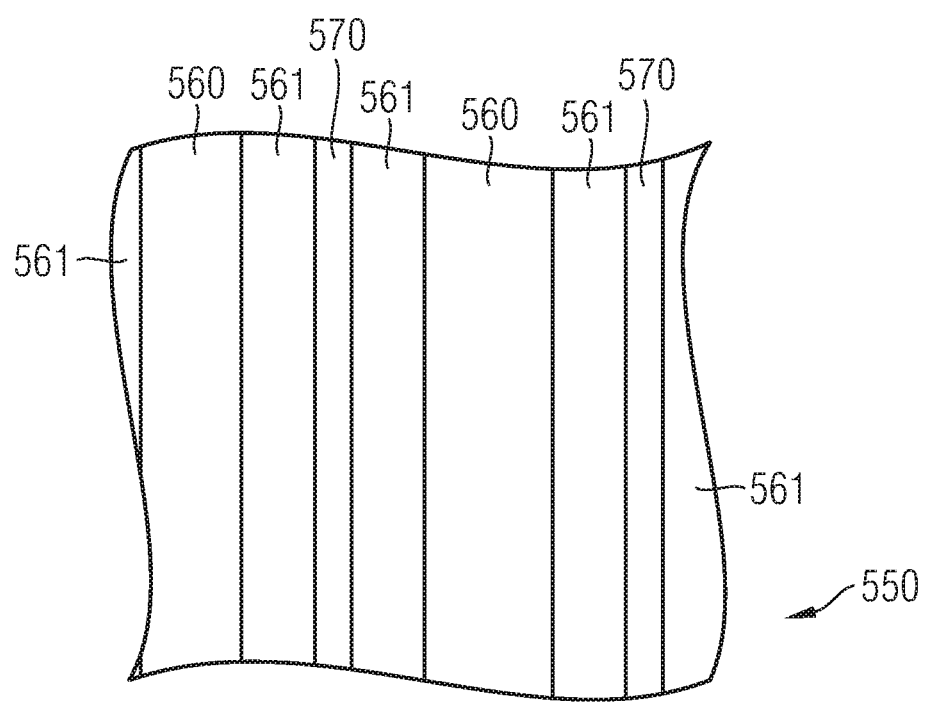
FIG. 5B is a schematic top view of a portion of a transistor cell array in accordance with another embodiment of a semiconductor device including a stripe-shaped design of gate and source trenches.

FIG. 5B illustrates a schematic plan view of a transistor cell array layout including stripe-shaped gate trenches 570, stripe-shaped source trenches 560 and stripe-shaped mesa regions 561. Examples of the transistor cells of semiconductor device 500 in cross-sectional view are given in the embodiments described above with reference to FIGS. 1 to 4.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a source trench extending into a semiconductor body from a first surface of the semiconductor body;
   forming a source trench dielectric and a source trench electrode in the source trench;
   forming a gate trench dielectric and a gate trench electrode in a gate trench extending into the semiconductor body from the first surface;
   forming a body region of a first conductivity type between the gate and source trenches;
   forming a source region of a second conductivity type different from the first conductivity type between the gate and source trenches;
   forming an interconnection electrically coupling the body region and the source trench electrode, wherein the interconnection adjoins a lateral face of the source trench electrode of the body region; and
   forming a source contact on the source trench electrode at the first surface,
   wherein forming the source trench, the source trench dielectric and the source trench electrode comprises:
   forming a first source trench and a second source trench;
   forming a first insulating layer lining sidewalls and a bottom side of the first and second source trenches;
   forming a first conducting material in the first and second source trenches, and wherein the method further comprises:
   forming a first recess in the semiconductor body between the first and second source trenches;
   forming a second insulating layer lining sidewalls and a bottom side of the first recess; and
   filling the first recess with a dummy material configured to be selectively removed with respect to the second insulating layer.

2. The method of claim 1, wherein the recess is filled with at least one of carbon and nitride.

3. The method of claim 1, further comprising removing the second insulating layer selectively with respect to the dummy material at least up to a bottom side of the first recess.

4. The method of claim 3, further comprising:
   forming a mask on the first surface, wherein the mask covers only a first part of each of the source trench dielectrics, the first part being arranged between a second part of each of the source trench dielectrics and a respective source trench electrode; and
   selectively removing the first part of each of the source trench dielectrics at least up to a bottom side of the first recess.

5. The method of claim 3, further comprising:
   removing the second insulating layer from each of the source trench dielectrics selectively with respect to the dummy material at least up to a bottom side of the first recess.

6. The method of claim 3, further comprising:
   forming a semiconductor layer on an exposed surface of the semiconductor body between the gate trench and the first and second source trenches.

7. The method of claim 6, wherein the semiconductor layer is formed by selective epitaxial growth.

8. The method of claim 6, wherein forming the body region comprises in-situ doping of the semiconductor layer.

9. The method of claim 6, further comprising:
   forming a recess between the semiconductor layer and each of the source trench electrodes; and
   forming the interconnection by filling a conducting material in the recess.

10. The method of claim 1, wherein the interconnection is formed to laterally extend through the source trench dielectric in a direction that is parallel to the first surface and is formed to adjoin a lateral face of the source trench electrode and of the body region, the lateral face of the source trench electrode and of the body region being perpendicular to the first surface.

11. The method of claim 10, wherein the source trench and the source trench dielectric are formed such that an interface between the source trench dielectric and the semiconductor body at a sidewall of the source trench is step shaped at a transition between lower and upper parts of the source trench dielectric, and wherein the step shaped interface between the source trench dielectric and the semiconductor body directly contacts the source trench dielectric and the semiconductor body.

12. A method of manufacturing a semiconductor device, the method comprising:
    forming a source trench extending into a semiconductor body from a first surface of the semiconductor body;
    forming a source trench dielectric and a source trench electrode in the source trench;
    forming a gate trench dielectric and a gate trench electrode in a gate trench extending into the semiconductor body from the first surface;
    forming a body region of a first conductivity type between the gate and source trenches;
    forming a source region of a second conductivity type different from the first conductivity type between the gate and source trenches;
    forming an interconnection electrically coupling the body region and the source trench electrode, wherein the interconnection adjoins a lateral face of the source trench electrode of the body region; and
    forming a source contact on the source trench electrode at the first surface,
    wherein the interconnection is formed to laterally extend through the source trench dielectric in a direction that is parallel to the first surface and is formed to adjoin a lateral face of the source trench electrode and of the body region, the lateral face of the source trench electrode and of the body region being perpendicular to the first surface.

13. The method of claim 12, wherein the source trench and the source trench dielectric are formed such that an interface between the source trench dielectric and the semiconductor body at a sidewall of the source trench is step shaped at a transition between lower and upper parts of the source trench dielectric, and wherein the step shaped interface between the source trench dielectric and the semiconductor body directly contacts the source trench dielectric and the semiconductor body.

* * * * *